(12) United States Patent
Sinha et al.

(10) Patent No.: US 9,065,433 B2
(45) Date of Patent: Jun. 23, 2015

(54) CAPACITOR CHARGING CIRCUIT WITH LOW SUB-THRESHOLD TRANSISTOR LEAKAGE CURRENT

(71) Applicants: Anand Kumar Sinha, Noida (IN); Sanjay K. Wadhwa, Noida (IN)

(72) Inventors: Anand Kumar Sinha, Noida (IN); Sanjay K. Wadhwa, Noida (IN)

(73) Assignee: FREESCALE SEMICONDUCTOR, INC., Austin, TX (US)

( * ) Notice: Subject to any disclaimer, the term of this patent is extended or adjusted under 35 U.S.C. 154(b) by 320 days.

(21) Appl. No.: 13/743,323

(22) Filed: Jan. 16, 2013

(65) Prior Publication Data

US 2014/0197806 A1 Jul. 17, 2014

(51) Int. Cl.
  *H02J 7/00* (2006.01)
  *H03K 4/06* (2006.01)
(52) U.S. Cl.
  CPC ........................................ *H03K 4/06* (2013.01)
(58) Field of Classification Search
  CPC ... H02J 7/0042; H03L 7/0891; H03L 7/0895; H03K 4/06
  USPC .................................................. 320/166, 167
  See application file for complete search history.

(56) References Cited

U.S. PATENT DOCUMENTS

| | | | |
|---|---|---|---|
| 5,703,825 A | 12/1997 | Akiba | |
| 6,329,874 B1 | 12/2001 | Ye | |
| 6,859,083 B1 * | 2/2005 | Xin-LeBlanc et al. | ........ 327/309 |
| 6,917,192 B1 * | 7/2005 | Xin-LeBlanc et al. | .... 324/76.53 |
| 6,917,555 B2 | 7/2005 | Bedwell | |
| 7,113,430 B2 | 9/2006 | Hoefler | |
| 7,212,462 B1 | 5/2007 | Tuan | |

* cited by examiner

*Primary Examiner* — Vuthe Siek
(74) *Attorney, Agent, or Firm* — Charles Bergere

(57) ABSTRACT

A capacitor charging circuit has input, output and control nodes, first and second series connected primary FETs, and first and second leakage current reduction FETs. All of the FETs have their gates coupled to the control node. The first primary FET is coupled between the input and output nodes, and the second primary FET is coupled between the output node and a leakage current reduction node. The first leakage current reduction FET is coupled between a supply line and the leakage current reduction node, and the second leakage current reduction FET is coupled between the leakage current reduction node and ground. When a control signal at the control node is low, the first primary FET and the first leakage current reduction FET are conductive, and the second primary FET and the second leakage current reduction FET are non-conductive, which eliminates sub-threshold leakage current flowing through the second primary FET.

15 Claims, 3 Drawing Sheets

CAPACITOR CHARGING CIRCUIT WITH LOW SUB-THRESHOLD TRANSISTOR LEAKAGE CURRENT

BACKGROUND OF THE INVENTION

The present invention relates to electronic circuitry and, more particularly, to a capacitor charging circuit with low or reduced sub-threshold transistor leakage current.

Today's integrated circuits typically have many transistors, each of which can be either in a conductive or non-conductive state. When a Field Effect Transistor (FET) in a non-conductive state it should not allow any current flow between its drain and source terminals. However, in practice sub-threshold currents (leakage currents) may flow between the drain and source terminals even when the transistor has a gate to source voltage that biases the transistor to a non-conductive state.

Capacitor charging and discharging circuits include transistors that are susceptible to sub-threshold leakage currents. These sub-threshold leakage currents vary depending on variations in transistor temperature. It is therefore difficult to achieve a constant charging time across large temperature ranges for capacitors controlled by such circuits.

BRIEF DESCRIPTION OF THE DRAWINGS

The invention, together with objects and advantages thereof, may best be understood by reference to the following description of preferred embodiments together with the accompanying drawings in which.

DETAILED DESCRIPTION OF PREFERRED EMBODIMENTS

Figure 1:
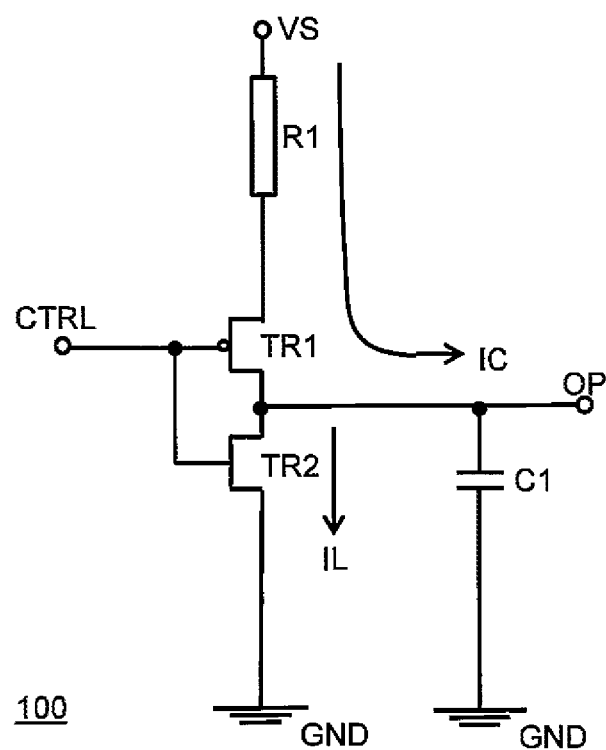
FIG. 1 is a schematic circuit diagram of a conventional circuit for controlling a charging and discharging of a capacitor.

The detailed description set forth below in connection with the appended drawings is intended as a description of presently preferred embodiments of the invention, and is not intended to represent the only forms in which the present invention may be practiced. It is to be understood that the same or equivalent functions may be accomplished by different embodiments that are intended to be encompassed within the spirit and scope of the invention. In the drawings, like numerals are used to indicate like elements throughout. Furthermore, terms "comprises," "comprising," or any other variation thereof, are intended to cover a non-exclusive inclusion, such that module, circuit, device components, structures and method steps that comprises a list of elements or steps does not include only those elements but may include other elements or steps not expressly listed or inherent to such module, circuit, device components or steps. An element proceeded by "comprises . . . a" does not, without more constraints, preclude the existence of additional identical elements that comprises the element.

In one embodiment, the present invention provides a capacitor charging circuit with low or reduced sub-threshold transistor leakage current. The circuit has an input node, an output node and a control node. There are two series connected primary field effect transistors, each of the transistors having a gate electrode coupled to the control node. A first one of the primary field effect transistors is coupled between the input node and the output node and a second one of the primary field effect transistors is coupled between the output node and a leakage current reduction node. There are also two series connected leakage current reduction field effect transistors, each of the leakage current reduction transistors having a gate electrode coupled to the control node. A first one of the leakage current reduction field effect transistors is coupled between a power supply line and the leakage current reduction node and a second one of the leakage current reduction field effect transistors is coupled between the leakage current reduction node and a ground line.

In operation, when a control signal at the control node is at a first voltage level the first one of the primary field effect transistors and the first one of the leakage current reduction field effect transistors are in a conductive state. Also, the second one of the primary field effect transistors and the second one of the leakage current reduction field effect transistors are in a non-conductive state.

In another embodiment the present invention provides a capacitor charging circuit with reduced sub-threshold transistor leakage current. The circuit has an input node, an output node and a control node. There are two series connected primary field effect transistors, each of the transistors having a gate electrode coupled to the control node. A first one of the primary field effect transistors is coupled between the input node and the output node and a second one of the primary field effect transistors is coupled between the output node and a leakage current reduction node. There are two series connected leakage current reduction field effect transistors, each of the leakage current reduction transistors having a gate electrode coupled to the control node. A first one of the leakage current reduction field effect transistors is coupled between a power supply line and the leakage current reduction node and a second one of the leakage current reduction field effect transistors is coupled between the leakage current reduction node and a ground line.

In operation, when a control signal at the control node is at a ground potential the first one of the primary FETs and the first one of the leakage current reduction FETs are in a conductive state. Also, the second one of the primary FETs and the second one of the leakage current reduction FETs are in a non-conductive state thereby substantially eliminating a sub-threshold leakage current flowing through the second one of the primary FETs.

Referring to FIG. 1, a schematic circuit diagram of a conventional circuit 100 for controlling a charging and discharging of a capacitor is shown. The circuit 100 includes two series connected complementary FETs TR1 and TR2 each having a gate electrode coupled to a control node CTRL. TR1 is a p-type transistor and TR2 is an n-type transistor. TR1 has a source coupled to a resistor R1 and a drain coupled to an output node OP of the circuit 100. TR2 has a drain coupled to the output node OP and a source coupled to a ground line GND. The resistor R1 couples the source of TR1 to a power supply line VS and a capacitor C1 is coupled across the output node OP and the ground line GND.

In operation, when the control node CTRL is at a ground potential, TR1 is in a conductive state and TR2 is in a non-conductive state. TR1 therefore allows a charge current IC to flow through resistor R1 that charges the capacitor C1. The rate of charge of capacitor C1 is dependent on the resistance value of R1, the voltage drop across TR1 and the leakage current IL of TR2. This leakage current IL is known as a sub-threshold current that occurs even when the gate terminal of TR2 is at ground potential. This leakage current IL varies with temperature and thus it is difficult to consistently charge the capacitor C1 to a specific voltage value during a specific time frame across temperature. Thus, when the circuit 100 is used to charge and discharge capacitors (e.g., capacitor C1) in circuits such as relaxation oscillators, then large variations in output frequencies can occur due to variations in ambient temperature conditions. The problem is even more severe when the resistance value R1 is large for obtaining a low output frequency. This problem is not limited to oscillators and can occur when the circuit 100 is used in analogue to digital converters, memory circuits and any other circuit that requires controlled charging rates, across temperature, of one or more capacitors.

Figure 2:
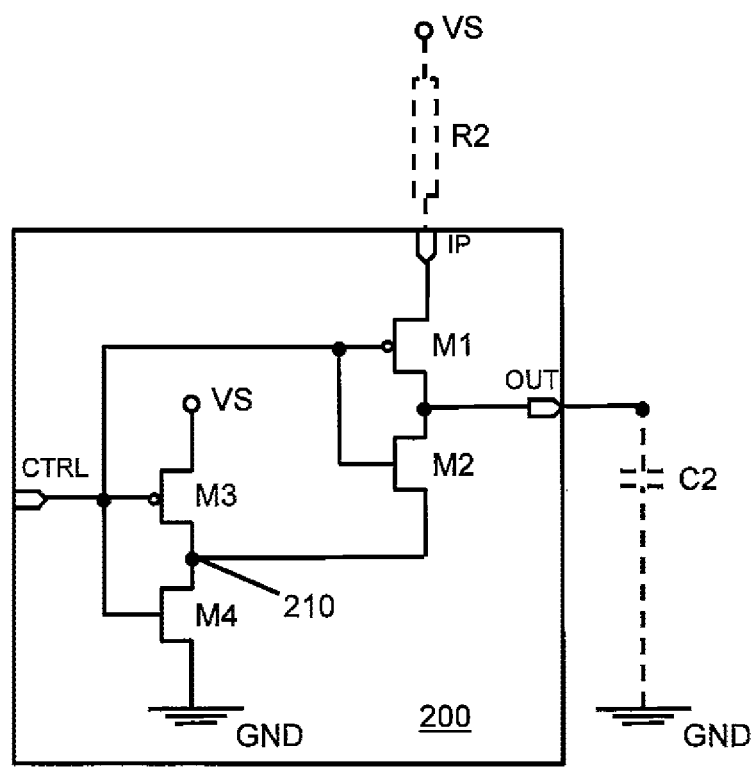
FIG. 2 is a schematic circuit diagram of a capacitor charging circuit with reduced sub-threshold transistor leakage current in accordance with a preferred embodiment of the present invention.

Referring to FIG. 2, a schematic circuit diagram of a capacitor charging circuit 200 with reduced or low sub-threshold transistor leakage current in accordance with a preferred embodiment of the present invention is shown. The circuit 200 includes an input node IP, an output node OUT and a control node CTRL. There are two series connected primary FETs M1 and M2 each having a gate electrode coupled to the control node CTRL. A first one of the primary FETs M1 is coupled between the input node IP and the output node OUT and a second one of the primary FETs M2 is coupled between the output node OUT and a leakage current reduction node 210. The first primary FET M1 is a p-type transistor having its source connected to the input node and its drain connected to the output node. The second primary FET M2 is an n-type transistor with its drain connected to the output node OUT and its source connected to the leakage current reduction node 210.

The circuit 200 also includes two series connected leakage current reduction FETs M3 and M4, each having a gate electrode coupled to the control node CTRL. A first one the leakage current reduction FETs M3 is coupled between a power supply line VS and the leakage current reduction node 210 and a second one of the leakage current reduction FETs M4 is coupled between the leakage current reduction node 210 and a ground line GND. The first leakage current reduction FET M3 is a p-type transistor and has its source connected to the power supply line VS and its drain connected to the leakage current reduction node 210. The second leakage current reduction FET M4 is an n-type transistor with its drain connected to the leakage current reduction node 210 and its source connected to the ground line GND.

In one embodiment the primary FETs M1 and M2 are a complementary pair of FETs. Similarly, the leakage current reduction FETs M3 and M4 are a complementary pair of FETs. Also, the input node IP can be coupled directly to the power supply line VS, or through a resistance such as a resistor R2, or through another transistor. Furthermore, in one embodiment a capacitor C2 is coupled across the output node OUT and the ground line GND.

In operation, when a control signal CS at the control node CTRL is at a first voltage level that is substantially at a ground line potential GND, the first primary FET M1 and the first leakage current reduction FET M3 are in a conductive state. In contrast, when the control signal CS is substantially at the ground line potential GND, the second primary FET M2 and the second leakage current reduction FET M4 are in a non-conductive state.

When the control signal CS is at a second voltage level that is substantially at a potential of the power supply line VS, the first primary FET M1 and the first leakage current reduction FET M3 are in a non-conductive state. In contrast, when control signal CS is substantially at a potential of the power supply line VS the second primary FET M2 and the second leakage current reduction FET M4 are in a conductive state.

From the above, it will be apparent that when the control signal CS is at the first voltage level of the ground line potential GND, the first leakage current reduction FET M3 connects the source of the second primary FET M2 to the power supply line. As a result, a gate to source voltage Vgs develops between the gate and source terminals of the second primary FET M2. This gate to source voltage Vgs is greater than, and opposite to, the threshold voltage required for conduction of the second primary FET M2. More specifically, this gate to source voltage Vgs is substantially minus the potential of the power supply line VS; thus since the threshold voltage is typically +0.6V to 1.2V for the second primary FET M2 and the applied gate to source voltage Vgs is typically −5V (assuming VS=approximately 5 Volts) then the leakage current (sub-threshold current) through transistor M2 is substantially limited. In other words, the negative gate to source voltage at the transistor M2 effectively results in substantially eliminating (for most practical purposes) sub-threshold leakage current flowing through transistor M2. As a result, the intentional charging current will flow through capacitor C2, and there will be negligible charging current difference with temperature even for very low charging current (nA) applications.

Figure 3:
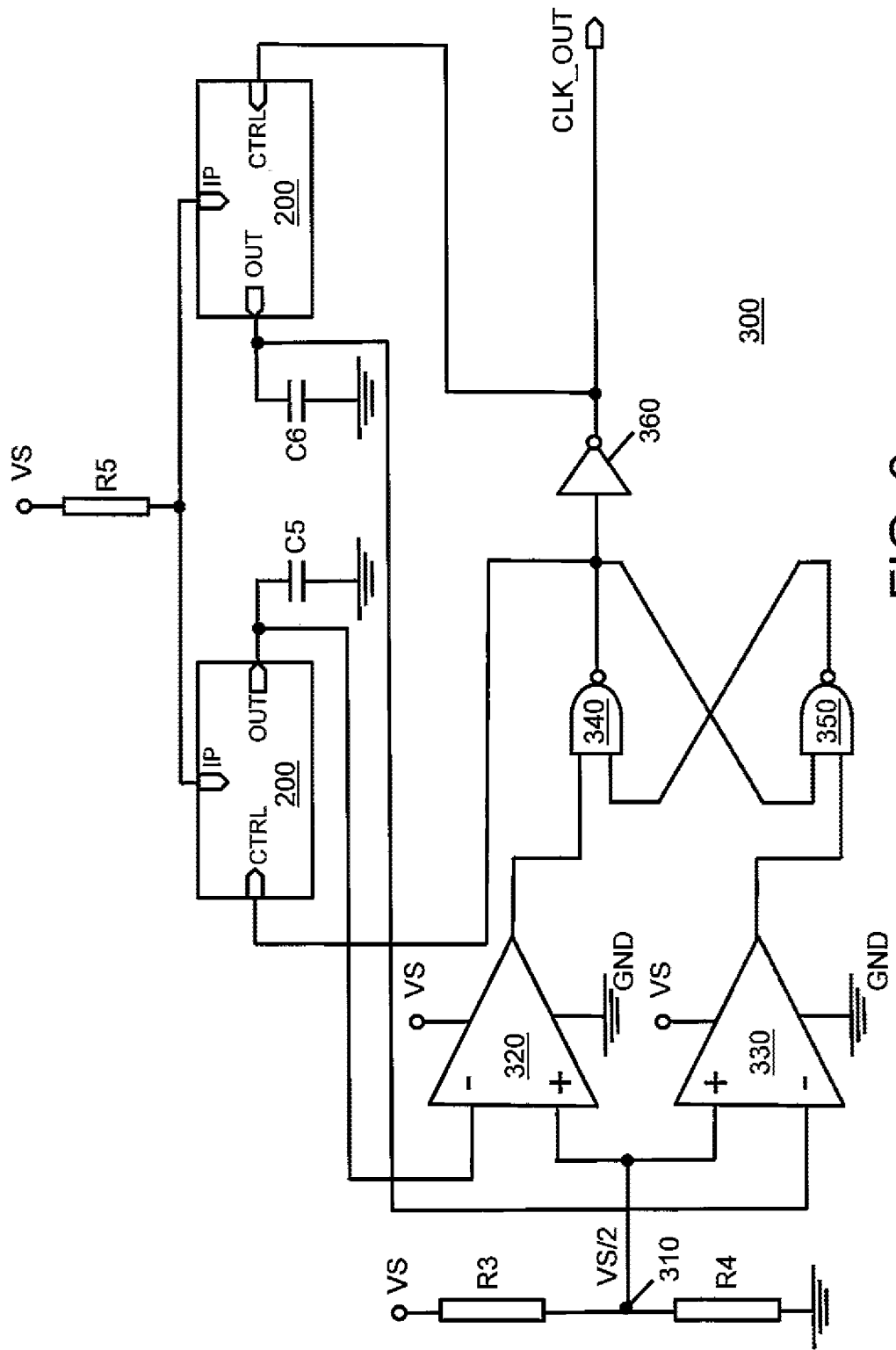
FIG. 3 is a schematic block diagram of a relaxation oscillator including the circuit of FIG. 2 in accordance with a preferred embodiment of the present invention.

Referring now to FIG. 3, a schematic block diagram of a relaxation oscillator 300 including two of the capacitor charging circuits 200, in accordance one embodiment of the present invention, is shown. The relaxation oscillator 300 includes two series connected resistors R3, R4 coupled across a power supply line VS and a ground line GND. In this embodiment, the resistors R3 and R4 are of equal Ohmic value and a common node 310 of the resistors R3, R4 therefore has a voltage value of VS/2. First and second comparators 320 and 330 each have a non-inverting input coupled to the common node 310. An output of the first comparator 320 is coupled to a first input of a first two input NAND gate 340 and an output of the second comparator 330 is coupled to a first input of a second two input NAND gate 350. An output of the first NAND gate 340 is coupled to a second input of the second NAND gate 350 and an output of the second NAND gate 350 is coupled to a second input of the first NAND gate 340. An output of the first NAND gate 340 also is coupled to an input of an inverter 360. The output of the inverter 360 provides an output CLK_OUT of the relaxation oscillator 300.

A first one of the capacitor charging circuits 200 (the left one of the two shown in FIG. 3) has its control node CTRL connected to the output of the first NAND gate 340; and its output node OUT is coupled to an inverting input of the first comparator 320. A second one of the capacitor circuits 200 (the right one of the two shown in FIG. 3) has its control node CTRL coupled to the output of the inverter 360 for receiving the output CLK_OUT, and its output node OUT coupled to an inverting input of the second comparator 330. The input nodes IP of both of the capacitor charging circuits 200 are connected to one end of a resistor R5, and the other end of the resistor R5 is connected to the power supply line VS. A capacitor C5 is coupled between the output node OUT of the first circuit 200 and ground GND and a capacitor C6 is coupled across the output node OUT of the second circuit 200 and ground GND.

In operation, since the rate of charging of capacitors C5 and C6 is controlled by the first and second ones of the capacitor charging circuits 200, which lower sub-threshold leakage currents in capacitor charging, the problems of leakage currents (sub-threshold currents) are at least substantially minimized. Furthermore, variations in sub-threshold leakage current with temperature may be reduced. Thus, the consistency of the clock frequency at the output CLK_OUT of the relaxation oscillator 300 may be improved over a relatively wide range of temperature variations when the circuits 200 are included in the relaxation oscillator 300.

Advantageously, the present invention provides for a relatively constant charging time for a capacitor across temperature when the capacitor is coupled to a circuit that controls charging and discharging of the capacitor. The present invention achieves this relatively constant charging time over temperature variations due to providing a suitable bias at a source of a discharging transistor (primary FET M2). This suitable bias substantially reduces or substantially eliminates sub-threshold currents or leakage currents through the primary FET M2.

The description of the preferred embodiments of the present invention has been presented for purposes of illustration and description, but is not intended to be exhaustive or to limit the invention to the forms disclosed. It will be appreciated by those skilled in the art that changes could be made to the embodiments described above without departing from the broad inventive concept thereof. It is understood, therefore, that this invention is not limited to the particular embodiment disclosed, but covers modifications within the spirit and scope of the present invention as defined by the appended claims.

The invention claimed is:

1. A capacitor charging circuit with reduced sub-threshold transistor leakage current, the circuit comprising:
   an input node;
   an output node;
   a control node;
   first and second series connected primary field effect transistors, each of the primary transistors having a gate electrode coupled to the control node, and wherein the first primary transistor is coupled between the input node and the output node and the second primary transistor is coupled between the output node and a leakage current reduction node; and
   first and second series connected leakage current reduction field effect transistors, each of the leakage current reduction transistors having a gate electrode coupled to the control node, and wherein the first leakage current reduction transistor is coupled between a power supply line and the leakage current reduction node and the second leakage current reduction transistor is coupled between the leakage current reduction node and a ground line,
   wherein, in operation, when a control signal at the control node is at a first voltage level, the first primary transistor and the first leakage current reduction transistor are in a conductive state and the second primary transistor and the second leakage current reduction transistor are in a non-conductive state,
   wherein, in operation, the first voltage level is substantially at a ground potential and the second voltage level is substantially at a potential of the power supply line, and
   wherein when the control signal is at the first voltage level, the first leakage current reduction transistor connects a source of the second primary transistor to the power supply line, thereby resulting in a gate to source voltage between the gate and source terminals of the second primary transistor that is greater than and opposite to a threshold voltage of the second primary transistor.

2. The circuit of claim 1, wherein in operation, when the control signal is at a second voltage level the first primary transistor and the first leakage current reduction transistor are in a non-conductive state and the second primary transistor and the second leakage current reduction transistor are in a conductive state.

3. The circuit of claim 2, wherein the first primary transistor and the first leakage current reduction transistor are p-type transistors and the second primary transistor and the second leakage current reduction transistor are n-type transistors.

4. The circuit of claim 3, wherein the primary field effect transistors are a complementary pair of field effect transistors.

5. The circuit of claim 4, wherein the leakage current reduction field effect transistors are a complementary pair of field effect transistors.

6. The circuit of claim 1, wherein when the control signal is at the first voltage level, the first leakage current reduction transistor connects a source of the second primary transistor to the power supply line, thereby resulting in a gate to source voltage between the gate and source terminals of the second primary transistor that is substantially minus the potential of the power supply line.

7. The circuit of claim 2, further comprising a capacitor coupled across the output node and the ground line.

8. The circuit of claim 7, wherein the input node is coupled to the power supply line through a resistance.

9. The circuit of claim 8, wherein the circuit forms part of a relaxation oscillator in which the control node is coupled to an output of the relaxation oscillator and the output node is coupled to an input of a comparator forming part of the relaxation oscillator circuit.

10. A capacitor charging circuit with reduced sub-threshold transistor leakage current, the circuit comprising:
    an input node;
    an output node;
    a control node;
    first and second series connected primary field effect transistors, each of the primary transistors having a gate electrode coupled to the control node, wherein the first primary transistor is coupled between the input node and the output node, and the second primary transistor is coupled between the output node and a leakage current reduction node; and
    first and second series connected leakage current reduction field effect transistors, each of the leakage current reduction transistors having a gate electrode coupled to the control node, wherein the first leakage current reduction transistor is coupled between a power supply line and the leakage current reduction node and the second one of the leakage current reduction transistors is coupled between the leakage current reduction node and a ground line,
    wherein, in operation, when a control signal at the control node is at a ground potential, the first primary transistor and the first leakage current reduction transistor are in a conductive state and the second primary transistor and the second leakage current reduction transistor are in a non-conductive state, thereby substantially eliminating a sub-threshold leakage current flowing through the second primary transistor,
    wherein the circuit forms part of a relaxation oscillator in which the control node is coupled to an output of the relaxation oscillator and the output node is coupled to an input of a comparator forming part of the relaxation oscillator circuit.

11. The circuit of claim 10, wherein in operation, when the control signal is at a potential of the power supply line the first primary transistor and the first leakage current reduction transistor are in a non-conductive state and the second primary transistor and the second leakage current reduction transistor are in a conductive state.

12. The circuit of claim 11, wherein the first primary transistor and the first leakage current reduction transistor are p-type transistors, and the second primary transistor and the second leakage current reduction transistor are n-type transistors.

13. The circuit of claim 11, wherein the primary transistors are a complementary pair of field effect transistors and wherein the leakage current reduction transistors are a complementary pair of field effect transistors.

14. The circuit of claim 13, wherein the input node is coupled to the power supply line through a resistance.

15. The circuit of claim 14, further comprising a capacitor coupled across the output node and the ground line.

* * * * *